United States Patent [19]

Dension et al.

[11] 4,260,649
[45] Apr. 7, 1981

[54] LASER INDUCED DISSOCIATIVE CHEMICAL GAS PHASE PROCESSING OF WORKPIECES

[75] Inventors: Dean R. Dension, Los Gatos; Larry D. Hartsough, Berkeley, both of Calif.

[73] Assignee: The Perkin-Elmer Corporation, Norwalk, Conn.

[21] Appl. No.: 36,828

[22] Filed: May 7, 1979

[51] Int. Cl.³ .............................................. B05D 3/06
[52] U.S. Cl. .................................. 427/53.1; 156/635; 156/643; 156/646; 204/DIG. 11; 118/50.1; 118/730
[58] Field of Search .................. 427/53; 156/635, 643, 156/646; 204/DIG. 11; 118/50.1, 730

[56] References Cited

U.S. PATENT DOCUMENTS

| | | | |
|---|---|---|---|
| 2,841,477 | 7/1958 | Hall | 156/643 |
| 3,122,463 | 2/1964 | Ligenza et al. | 156/643 |
| 3,271,180 | 9/1966 | White | 427/53 |
| 3,364,087 | 1/1968 | Solomon et al. | 156/635 |
| 3,494,768 | 2/1970 | Schaefer | 156/635 |

OTHER PUBLICATIONS

Letokhov, "Science", vol. 180, No. 4085, May 4, 1973, pp. 451–458.

Oraevskii, "Khimiya Vysokikh Energii", vol. 11, No. 2, Mar.–Apr. 1977, pp. 152–155.

Primary Examiner—John H. Newsome
Attorney, Agent, or Firm—Salvatore A. Giarratana; Francis L. Masselle; Edwin T. Grimes

[57] ABSTRACT

Method and apparatus for chemical treatment of workpieces is disclosed wherein a workpiece to be processed is exposed to a controlled gaseous atmosphere containing a gaseous constituent to be dissociated by laser radiation to produce a gaseous reactant product for reaction with a surface of the workpiece for chemical processing of the workpiece. The wavelength of the laser beam radiation is selected for splitting only the desired bonds to produce only the desired reactant product without producing undesired by-products which could deleteriously interfere with the desired chemical reaction. Specific examples of the desired laser induced dissociation to produce desired reactant products include, but are not limited to: dissociation to produce reactive oxygen for chemical reaction with photoresist for removing, or "ashing" the photoresist, laser induced dissociation of halocompounds to produce reactive halogen or halogen compounds for metal etching; and laser induced dissociation of fluorocompounds to produce reactive fluorine of fluorocompounds for selective etching of siliconiferous, metallic, or ceramic materials. The method and apparatus of the present invention is especially well suited for semiconductor wafer processing.

16 Claims, 1 Drawing Figure

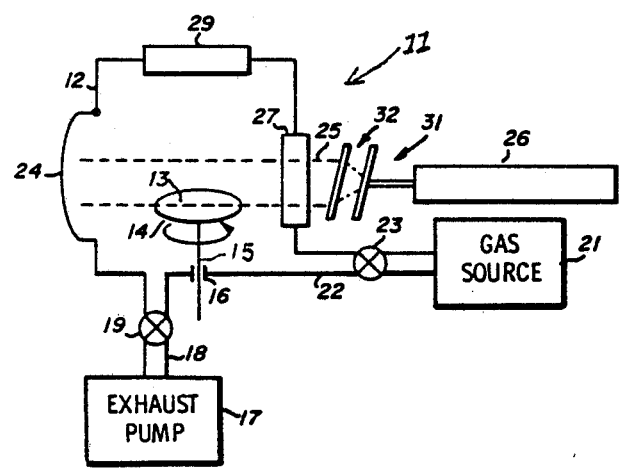

LASER INDUCED DISSOCIATIVE CHEMICAL GAS PHASE PROCESSING OF WORKPIECES

BACKGROUND OF THE INVENTION

The present invention relates in general to chemical gas phase processing of workpieces and, more particularly, to such processing employing laser induced dissociation of gaseous constituents to produce reactant products for chemical treatment of the workpieces.

DESCRIPTION OF THE PRIOR ART

Heretofore, workpieces such as semiconductor wafers have been processed by effecting dissociation of gaseous constituents of a controlled gaseous atmosphere to produce a reactant gaseous product for chemical reaction with the surface of the workpiece for processing thereof. One such prior art class of processing equipment includes plasma etching and plasma deposition equipment. In these plasma processing equipments, the dissociation is typically produced either by an electrical discharge or by ultraviolet light irradiation of the gaseous constituent to be dissociated. The problem with these prior art systems is that the dissociation is not selective and many undesired side reactant products are produced which can deleteriously interfere with the desired chemical reaction at the surface of the workpiece being treated. In addition, undesired high energy radiation and particles are generated in the plasma which can produce dislocations in the lattice structure of semiconductors resulting in an unnecessarily high defect concentration in semiconductor devices being processed, thereby reducing yield or degrading their electrical performance.

It is also known from the prior art to process semiconductive wafers by irradiating selective portions of the wafer with a beam of laser radiation to evaporate from the irradiated surface of the wafer certain materials such as resistors for trimming thereof and the like. However, this method of laser processing of wafers does not involve a laser induced gas phase chemical reaction with the surface of the wafer or with the surface of the workpiece being treated.

It is also known from the prior art to process workpieces by irradiating the surface of the workpiece with a laser beam to produce localized heating thereof which can then produce thermal dissociation of gaseous constituents such as tungsten hexafluoride and the like so that a metal constituent of the gaseous component is thermally dissociated and deposited upon the laser heated surface of the wafer being treated. This dissociation is pyrolytic and not directly the result of the laser beam interacting with the dissociated molecule.

SUMMARY OF THE PRESENT INVENTION

The principal object of the present invention is the provision of an improved method and apparatus for chemical gas phase processing of workpieces and, more particularly, to such a method and apparatus which provides selective laser induced dissociation of a gaseous component to produce a desired gaseous reactant product for chemical processing of the workpiece.

According to one feature of the present invention, the workpiece to be processed is exposed to a controlled gaseous atmosphere containing a gaseous constituent which is to be dissociated by a high power density laser beam of a selected wavelength directed into the gaseous atmosphere in close proximity to the surface to be treated, but spaced a finite distance therefrom, to selectively dissociate the gaseous constituent to produce a gaseous reactant product for reaction with a surface of the workpiece for chemical processing thereof.

According to another feature of the present invention, the reactant product is selected from the class consisting of F, $CF_3$, $CF_2$, CF, $NF_2$, NF, $BCl_2$, Cl, and O.

According to still another feature of the present invention, the gaseous constituent to be dissociated is selected from a class consisting of $O_2$, $CCl_4$, $BCl_3$, $CF_3I$, $CDF_3$, $CF_4$, $SiH_4$, $NH_3$, $CHF_3$, $CFCl_3$, $N_2F_4$, fluorocompounds and halocarbons.

As yet another feature of the present invention, the workpiece comprises a semiconductor wafer.

According to another feature of the present invention, a cross sectional dimension of the laser beam is expanded and the expanded beam is directed through the gaseous atmosphere in a direction substantially parallel to a surface of the workpiece to be treated and relatively closely spaced therefrom.

Other features and advantages of the present invention will become apparent upon a perusal of the following specification taken in connection with the accompanying drawings wherein:

BRIEF DESCRIPTION OF THE DRAWINGS

The FIGURE is a schematic longitudinal sectional view of a workpiece processing station incorporating features of the present invention.

DESCRIPTION OF THE PREFERRED EMBODIMENT

Referring now to the FIGURE there is shown a workpiece chemical gas phase processing station 11 incorporating features of the present invention. The processing station 11 includes an evacuable envelope 12 for containing the workpiece 13 to be processed. In a typical example, the workpiece 13 comprises a semiconductor wafer as of 1 to 6 inches in diameter and 0.127 to 0.89 mm thick and supported upon a rotatable chuck 14 which is rotated within the evacuable envelope 12 via the intermediary of a shaft 15, and a vacuum mechanical motion feed-through 16.

The gaseous atmosphere within the evacuable chamber 12 is controlled by means of an exhaust pump 17 connected in gas communication with the envelope 12 via the intermediary of exhaust tubulation 18 and valve 19. A source of gas 21 is also connected in gas communication with the evacuable envelope 12 via the intermediary of feed tubulation 22 and valve 23. The gaseous atmosphere within the envelope 12 is controlled by exhausting the gas therein and admitting controlled amounts of preselected gaseous constituents derived from the gas source 21. The flow of gas from the gas source 21 through the envelope 12 to the exhaust pump 17 can be maintained by controlling the valves 19 and 23. A vaccum lock 24 is provided in the envelope 12 for introducing workpieces 13 into the chamber 12.

A beam of laser radiation 25 is directed from a laser source 26 through an optically transparent gas tight window 27 into the gaseous atmosphere within the chamber 12 for dissociating a gaseous constituent within the chamber to produce a desired gaseous reactant product for reaction with a surface of the workpiece for processing thereof. A viewing port 29 of optical quality glass is provided in the envelope 12 for viewing of the workpiece during process thereof.

In a typical example, the laser 26 comprises a pulsed tunable high power $CO_2$ laser, such as a TEA laser which is tunable to a desired wavelength for selective dissociation of a selected gaseous component. The typical window material for the laser beam entrance window 27 includes zinc selenide with an anti-reflection coating. The valves 19 and 23 and the exhaust pump 17 are controlled for maintaining the pressure within the chamber 12 at a desired pressure within the range of $10^{-3}$ torr to 1 atmosphere.

It will be appreciated that the laser beam 25 is directed through the window 27 in a direction generally parallel to the surface of the workpiece 13 to be treated. A cylindrical lens is arranged so that the cross sectional area of the beam 25 is expanded in essentially only one dimension so as to produce a beam cross section which is relatively broad and thin. The broad dimension of the beam cross section is then arranged to be generally parallel to the surface of the workpiece to be treated and the spacing of the beam from the workpiece is relatively close i.e., less than a few mean free path lengths of the gaseous molecules within the chamber 12. This has the advantage that the gaseous reactant product is generated in close proximity to the surface to be treated such that the chances of recombination before chemical reaction with the surface being treated is reduced. Also, the system has the advantage that the surface being treated is not irradiated with the laser beam.

Samples of various chemical processing steps to be carried out within the aforedescribed work stations 11 and 31 are as follows:

EXAMPLE I

Selective etchings of a silicon oxide layer overlaying a silicon wafer substrate workpiece 13 is obtained by introducing trifluoromethyliodide ($CF_3I$) into the chamber 12 from the gas source 21 at a few Torr pressure and irradiating the trifluoreomthyliodide with the R(14) [9.6 $\mu$m] $CO_2$ laser line from a TEA laser 26 at a laser fluence of 1.2 J/cm$^2$ with a pulse width of 10 ns to 1 $\mu$s to dissociate the $CF_3I$ molecule into I+$CF_3$ (neutral radical). The $CF_3$ diffuses to the surface of the workpiece to be treated and reacts chemically thereat with the silicon dioxide to produce $SiF_4$ plus oxygen. Thus, the dissociation reactant product serves to selectively etch and remove the silicon dioxide. The $SiF_4$ and oxygen products are exhausted from the system via exhaust pump 17.

EXAMPLE II

In this example, the method is essentially the same as that of Example I with the exception that the gaseous constituent to be dissociated comprises $CDF_3$ at a few Torr partial pressure in a buffer gas of argon at 50 Torr partial pressure. The $CDF_3$ is dissociated by using the R(26) and R(28) [10.6 $\mu$m] $CO_2$ laser lines of beam 25 at 25 J/cm$^2$ to produce $CF_2$ and DF. The $CF_2$ forms the reactant product which chemically reacts with the silicon dioxide at the surface of the wafer to produce selective chemical etching thereof. The byproducts resulting from the etching are removed by the exhaust pump 17.

EXAMPLE III

This example is essentially the same as that of Example I with the exception that the gaseous constituent which is dissociated within the chamber 12 comprises $CFCl_3$ which is dissociated by the laser beam 25 to produce CF reactant product which reacts with the silicon dioxide at the surface of the wafer for selectively etching thereof. The byproducts of the etching process are removed by the exhaust pump 17.

EXAMPLE IV

This example is an example of selective etching of a metal over silicon or metal over silicon dioxide and comprises introducing gaseous $BCl_3$ at a few Torr pressure into the chamber 12 and irradiating the gaseous atmosphere with 25 at the P(20) [10.6 $\mu$m] $CO_2$ laser line to dissociate the $BCl_3$ to $BCl_2$ and Cl. The Cl component (and perhaps $BCl_2$) comprises the reactant product which reacts with the metal on the surface of the wafer workpiece to selectively etch the metal. Metals to be etched in this manner includes aluminum, tungsten, titanium, chromium and alloys thereof.

EXAMPLE V

This method is essentially the same as that of Example II with the exception that the gaseous constituent to be dissociated comprises $N_2F_4$ at a partial pressure of 2–20 Torr in a buffer gas of argon at a partial pressure of 0–85 Torr. The pulse energies are in the range of 0.3 to 1.0 J/cm$^2$. The reactant product is $NF_2$. Even higher yields of $NF_2$ are obtained by dissociating $SF_5NF_2$ at a laser wavelength of 950 cm$^{-1}$, with laser fluences in the range of 0.1–1.0 J/cm$^2$.

EXAMPLE VI

This method is for selective stripping of a photoresist layer on a workpiece and comprises introducing a gaseous constituent of $O_2$ which is dissociated by the laser beam 25 radiation to produce atomic oxygen which reacts with the photoresist to oxidize and remove same.

Alternative gaseous constituents for use in lieu of $CF_3I$ in Example I include: $CF_3Br$ at R(26) or R(28) 9.6 $\mu$m $CO_2$ lines at 2 J/cm$^2$, or $CF_3NO$, $C_2F_2$ at R(36) 9.6 $\mu$m $CO_2$ line at 6 J/cm$^2$; or hexafluoroacetone, $(CF_3)_2CO$ at R(12) 10.6 $\mu$m $CO_2$ line at 0.1–1.0 J/cm$^2$.

An alternative gaseous constituent to be dissociated in Example II includes: $CF_2HCl$, $CF_2HBr$, $CF_2Cl_2$, $CF_2Br_2$, $CF_2CFCl$, $CF_2CFH$, and $CF_2CF_2CH_2$.

The advantages of the method and apparatus of the present invention, as contrasted with prior plasma processing methods and apparatus, include the ability to use a much relaxed vacuum requirement in the chamber containing the reactant product. A second advantage is that the radiation damage to the workpiece is substantially reduced, that is, fewer charges are implanted resulting in less dislocations of the substrate lattice. These dislocations and defects in the lattice were heretofore produced by ion bombardment, electron bombardment, UV, and X radiation. This is particularly important when the technology advances to a higher density of devices and shallower diffusion layers which are more susceptible to radiation damage. By reducing the radiation damage, the necessity for annealing the damaged surface is avoided.

A further advantage is that a more specific dissociation reaction is obtainable by means of the laser radiation than by the prior art plasma discharges, such that undesired dissociation products are avoided, thereby avoiding undercutting of the mask and resulting in more efficient use of the gas and higher processing rates, and higher selectivity in etching one material over another.

FCO reactant product is derived by laser dissociation in the infrared of either $F_2CO$ or $(FCO)_2$.

What is claimed is:

1. In the method of chemical treatment of workpieces, the steps of:
   exposing a workpiece to a gaseous atmosphere containing a gaseous constituent which is to be dissociated to produce a gaseous reactive product;
   directing a high power density beam of laser radiation into the gaseous atmosphere in close proximity to a surface of the workpiece to be treated, but spaced a finite distance therefrom, to dissociate the gaseous constituent to produce the gaseous reactive product; and
   reacting the gaseous reactant product with said surface of the workpiece for processing of the workpiece.

2. The method of claim 1 wherein the reactant product includes a halogen.

3. The method of claim 1 wherein the reactant product is selected from the class consisting of F, $CF_3$, $CF_2$, CF, $NF_2$, NF, Cl, O, $BCl_2$, BCl, and FCO.

4. The method of claim 1 wherein the gaseous constituent to be dissociated is selected from the class consisting of $O_2$, $CCl_4$, $BCl_3$, $CDF_3$, $CF_4$, $SiH_4$, $CFCl_3$, $F_2CO$, $(FCO)_2$, $SF_5NF_2$, $N_2F_4$, $CF_3Br$, $CF_3NO$, $(CF_3)_2CO$, $CF_2HCl$, $CF_2HBr$, $CF_2Cl_2$, $CF_2Br_2$, $CF_2CFCl$, $CF_2CFH$, $CF_2CF_2CH_2$, $NH_3$, $CHF_3$, fluorohalides and halocarbons.

5. The method of claim 1 when the workpiece comprises a semiconductor wafer.

6. The method of claim 1 wherein the reactant product is reacted with the surface of the workpiece to produce etching of the workpiece.

7. The method of claim 1 wherein the surface of the workpiece is coated with a layer of photoresist and the reactive product is reacted with the photoresist to effect removal thereof.

8. The method of claim 1 wherein the step of directing the laser beam into the gaseous atmosphere comprises directing the laser beam in a direction substantially parallel to said surface of the workpiece in relatively closely spaced relation therefrom.

9. The method of claim 1 wherein the step of directing the beam into the gaseous atmosphere comprises the step of expanding a cross sectional dimension of the beam to produce a relatively broad thin beam and directing the broad beam into the gaseous atmosphere in a direction substantially parallel to said surface of the workpiece in closely spaced relation thereto.

10. In an apparatus for chemical treatment of workpieces:
    work station means for exposing a workpiece to a controlled gaseous atmosphere containing a gaseous constituent which is to be dissociated to produce a gaseous reactant product for reaction with a surface of the workpiece for chemical processing of the workpiece; and
    means for directing a high power density beam of laser radiation into said controlled gaseous atmosphere in close proximity to said surface, but spaced a finite distance therefrom, to dissociate said gaseous constituent to produce said gaseous reactant product.

11. The apparatus of claim 10 wherein said work station means includes an evacuable envelope for containing said controlled gaseous atmosphere and the workpiece to be processed.

12. The apparatus of claim 11 wherein said envelope means includes window means transparent to said laser radiation and sealed in a gas tight manner to said envelope means for passage of said laser beam therethrough into said controlled gaseous atmosphere.

13. The apparatus of claim 10 wherein said laser beam directing means includes, means for directing said laser beam in a direction substantially parallel to said surface of the workpiece to be treated in relatively closely spaced relation therefrom.

14. The apparatus of claim 10 wherein said beam directing means includes beam expanding means for expanding the cross sectional dimension of the laser beam into a relatively broad thin beam and directing said broad thin beam in a direction substantially parallel to said surface of the workpieces.

15. Apparatus according to claim 10 wherein said finite distance is less than a few mean free path lengths of the gaseous molecules in said work station means.

16. Apparatus according to claim 10 wherein said beam of laser radiation has a laser fluence of from about 0.1 to about 25 Joules per square centimeter.

* * * * *

UNITED STATES PATENT AND TRADEMARK OFFICE
CERTIFICATE OF CORRECTION

PATENT NO. : 4,260,649
DATED : Apr. 7, 1981
INVENTOR(S) : Dean R. Denison and Larry Hartsough It is certified that error appears in the above-identified patent and that said Letters Patent are hereby corrected as shown below:

First sheet of patent, change in Item [75], "Dean R. Dension" to --Dean R. Denison.

Signed and Sealed this

Seventeenth Day of November 1981

[SEAL]

Attest:

Attesting Officer

GERALD J. MOSSINGHOFF

Commissioner of Patents and Trademarks